April 25, 1967 C. HILSUM 3,316,464
LASER DIODE WITH METAL CONTACTS PLATED OVER THE SIDES OF THE SEMICONDUCTOR
Filed June 5, 1964
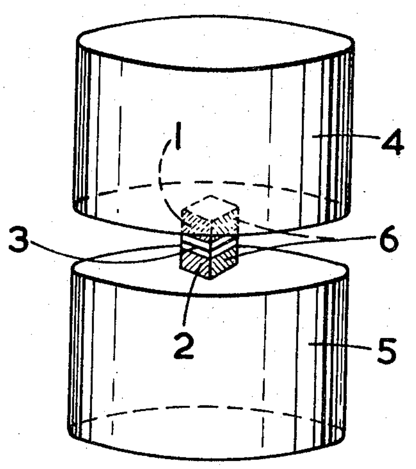
Inventor
Cyril Hilsum
By Cushman, Darby & Cushman
Attorneys

United States Patent Office 3,316,464
Patented Apr. 25, 1967

3,316,464

LASER DIODE WITH METAL CONTACTS PLATED OVER THE SIDES OF THE SEMICONDUCTOR

Cyril Hilsum, Malvern, England, assignor to National Research and Development Corporation, London, England, a British corporation Filed June 5, 1964, Ser. No. 372,812
Claims priority, application Great Britain, June 5, 1963, 22,457/63
4 Claims. (Cl. 317—234)

This invention relates to semiconductor diode construction.

One difficulty in the construction of a semiconductor diode lies in the provision of adequate heat-sinks for extracting and dissipating the considerable heat energy that can be developed during the passage of electrical currents through the diode. This problem arises particularly with heavy currents, such as are used when a diode is constructed to operate as a semiconductor laser for example. The densities of the currents used in this case can range from $10^3$ amps per cm.$^2$ at 77° K. to over $10^5$ amps per cm.$^2$ at room temperature. The two main considerations in the construction of suitable heat-sinks then are that firstly the thermal resistance between the diode and its heat-sinks must be low, and secondly that the electrical resistance between the diode and its electrical contacts must be low.

According to the invention a semiconductor diode is provided with two metallic stubs secured in good thermal and electrical contact with the *p* and *n* regions of the diode respectively, said stubs being large in comparison with the diode and serving as both heat-sinks and electrical contacts for the diode and Conductive plating—suitably gold—is provided extending over each semiconductor region of the diode as close as possible to the junction and continuing over at least part of each stub. This plating serves to improve heat flow from the junction to the stubs.

The stubs are conveniently of molybdenum and preferably the stub secured to the p-type region is plated with gold and zinc and the stub secured to the n-type region is plated with gold and tin.

In order that the invention may be the more readily carried into effect an embodiment thereof will now be described, by way of example only, with reference to the single figure of the drawing accompanying this specification.

The figure shows a simple semiconductor radiation emitting diode suitable for use in a laser system. The material of the diode may comprise a suitable semiconductor compound of a group III element with a group V element, for example gallium arsenide or gallium phosphide. The diode comprises a p-type region 1 and an n-type region 2 defining a junction 3 and is provided with two cylindrical molybdenum stubs 4, 5. The stub 4 is plated with gold and zinc and secured in good thermal and electrical contact with the p-type region 1 of the diode and the stub 5 is plated with gold and tin and secured in good thermal and electrical contact with the n-type region 2 of the diode. The addition of zinc to the gold plating the p-type region 1, and the addition of tin to the gold plating the n-type region 2, ensures ohmic contact between the stubs 4 and 5 and the diode. To ensure these high conductivity contacts gold plating 6 is formed round the base of each stub and over the semiconductor regions 1, 2 to within at most 100 microns from the junction 3. It is difficult to form this plating by conventional techniques so the following method may be adopted.

The diode is arranged in a jig, near a thin wire which lies parallel to one junction edge 3. The whole assembly is arranged at some distance from a silicon photo-cell, and current is passed through the diode in the forward direction. Radiation is emitted from the junction and this can be detected by the silicon photocell. The wire is moved until it lies immediately over and along the junction edge 3. This positioning is critical, and is achieved by monitoring the photocell output. When no radiation reaches the cell, the wire is in the correct position. A boat or container for evaporating metal is placed close to the silicon cell and when the wire is correctly positioned, metal—suitably gold—can be evaporated on to the diode. It will not cover the exposed junction edge 3 because this is shielded by the wire. The procedure is repeated with the diode rotated through 90°, and the other surfaces coated in the same way. By this method the contacts are brought close to the junction, and electrical and thermal resistance kept to a minimum.

I claim:

1. A semiconductor diode provided with two metallic stubs secured in good thermal and electrical contact with the *p* and *n* regions of the diode respectively, said stubs being large in comparison with the diode and serving both as heat-sinks and electrical contacts for the diode and a layer of conductive material extending over each semiconductor region of the diode except for a narrow strip on each side of the exposed junction edge and making ohmic contact with each said region and continuing over at least part of each metallic stub.

2. A semiconductor diode as claimed in claim 1 wherein the layer of conductive material comprises plating of gold and zinc over the p-type region of the diode, and comprises plating of gold and tin over the n-type region of the diode.

3. A semiconductor diode construction as claimed in claim 1 wherein the stubs are formed of molybdenum.

4. A semiconductor radiation emitting diode formed of a semiconductor compound of a group three element with a group five element and provided with two molybdenum stubs secured in good thermal and electrical contact with the *p* and *n* regions of the diode respectively, said stubs being large in comparison with the diode and serving both as heat-sinks and electrical contacts for the diode, and provided with plating of gold and zinc over the p-type region of the diode and plating of gold and tin over the n-type region of the diode, each area of plating extending over its respective semiconductor region except for at least a narrow strip on each side of the exposed junction edge and continuing over at least part of each molybdenum stub.

References Cited by the Examiner

UNITED STATES PATENTS 3,160,798 12/1964 Lootens et al. ______ 317—234
3,200,310 8/1965 Carman ____________ 317—234

JOHN W. HUCKERT, *Primary Examiner.*

M. EDLOW, *Assistant Examiner.*